United States Patent
Mayder et al.

(10) Patent No.: US 6,570,397 B2
(45) Date of Patent: May 27, 2003

(54) TIMING CALIBRATION AND TIMING CALIBRATION VERIFICATION OF ELECTRONIC CIRCUIT TESTERS

(75) Inventors: Romi Mayder, San Jose, CA (US); Noriyuki Sugihara, Campbell, CA (US); Andrew Tse, Castro Valley, CA (US); Randy L. Bailey, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 155 days.

(21) Appl. No.: 09/923,548

(22) Filed: Aug. 7, 2001

(65) Prior Publication Data

US 2003/0030453 A1 Feb. 13, 2003

(51) Int. Cl.[7] ............................................... G01R 31/02
(52) U.S. Cl. .................................... 324/754; 324/158.1
(58) Field of Search ............................ 324/754, 755, 324/763, 765, 73.1, 74, 158.1; 714/700, 726, 731, 733–734; 702/79, 89, 106, 118, 120, 125–126

(56) References Cited

U.S. PATENT DOCUMENTS

| | | | |
|---|---|---|---|
| 5,262,716 A | * 11/1993 | Gregory et al. | 324/754 |
| 5,539,305 A | 7/1996 | Botka | |
| 5,550,466 A | * 8/1996 | Botka | 324/158.1 |
| 5,712,855 A | 1/1998 | Goto et al. | |
| 5,821,764 A | 10/1998 | Slocum et al. | |
| 5,923,180 A | 7/1999 | Botka et al. | |
| 6,073,261 A | 6/2000 | Miller | |
| 6,105,157 A | 8/2000 | Miller | |
| 6,114,869 A | 9/2000 | Williams et al. | |
| 6,166,552 A | 12/2000 | O'Connell | |
| 6,181,145 B1 | 1/2001 | Tomita et al. | |
| 6,192,496 B1 | 2/2001 | Lawrence et al. | |
| 6,215,320 B1 | 4/2001 | Parrish | |
| 6,218,910 B1 | 4/2001 | Miller | |
| 6,492,797 B1 | * 12/2002 | Maassen et al. | 324/74 |

FOREIGN PATENT DOCUMENTS

| | | |
|---|---|---|
| WO | WO00/00836 | 1/2000 |
| WO | WO00/00837 | 1/2000 |
| WO | WO01/29571 | 4/2001 |

* cited by examiner

Primary Examiner—Kamand Cuneo
Assistant Examiner—Minh N. Tang (57) ABSTRACT

Systems and methods for calibrating the timing of electronic circuit testers and verifying the timing calibration of electronic circuit testers are described. In some embodiments, a calibration reference signal is transmitted from the test head directly through the load board interface, rather than through external instruments, so that timing errors associated with external wires and cables may be avoided. The timing calibration and timing calibration verification functionality is provided on a single calibration board, thereby reducing the calibration set-up time relative to conventional robot-based calibrators. In addition, a high pin count electronic circuit testers may be calibrated by a calibration board that is configured to calibrate one subset of the test channels at a time. In some embodiments, test channels are connected directly to calibration board comparators to avoid the accumulated signal degradation and the signal path route errors that may result from transmitting tester channel signals through a mechanical relay selection matrix.

20 Claims, 8 Drawing Sheets

TIMING CALIBRATION AND TIMING CALIBRATION VERIFICATION OF ELECTRONIC CIRCUIT TESTERS

TECHNICAL FIELD

This invention relates to systems and methods for timing calibration and timing calibration verification of electronic circuit testers.

BACKGROUND

Electronic circuit testers are designed to test the performance of a device or an integrated circuit. An electronic circuit tester may be used to test finished packaged devices and integrated circuits at various stages of manufacture of the device or an integrated circuit from the initial wafer processing stage to the final packaging stage.

A conventional programmable electronic circuit tester typically includes a test head that is electrically connected to one or more racks of electronic test and measurement instruments (e.g., ac and dc electrical signal generators, and signal analyzers, such as an oscilloscope and a network analyzer). The test head typically interfaces to a device or an integrated circuit through a load board that, in turn, is connected to a probe card (or fixture board). An electronic circuit tester typically includes a separate test channel for each terminal of a device to be tested. Each test channel may transmit a test signal to a device terminal or may receive and process a device output signal appearing at the device terminal. The load board and probe card assemblies provide signal paths between the circuit boards that are mounted in the test head and the terminals of a device to be tested. In general, the configuration of the load board depends on the category (e.g., analog or digital) of device or integrated circuit being tested. The configuration of the probe card, on the other hand, typically is specific to the family of device or integrated circuit being tested. The test head may be mounted pivotally on a dolly or other adjustable support mechanism so that the electronic circuit tester may be used to test both packaged devices and integrated circuits.

A typical electronic circuit tester tests a device under test (DUT) by applying test signals of various logic states to DUT input terminals. The states of the signals that are produced at DUT output terminals in response to the applied test signals are monitored to determine whether the DUT is behaving as expected. Each test channel includes a tristate driver for supplying a test signal to a DUT input terminal and a comparator for producing output data corresponding to the state of the DUT output signal produced at the DUT output terminal. A test typically is organized into a succession of test cycles. A channel may carry out one or more actions during a test cycle, including driving a test signal, tristating a test signal, and sampling a DUT output signal and comparing the sampled signal to expected states of the DUT terminal. Each test channel receives ACTION and TIMING data for each test cycle. A formatting and timing circuit within each test channel responds to the ACTION and TIMING data by producing three control signals: "TRISTATE," "DRIVE" and "COMPARE." The TRISTATE signal tristates the channel's driver and the DRIVE signal indicates whether the driver's output test signal is to be of a high or low logic level. The COMPARE signal controls when the comparator samples the state of the DUT output signal. The ACTION data input to the formatting and timing circuit indicates which of the DRIVE, TRISTATE, and COMPARE signals are to change state during a next test cycle, whereas the TIMING data indicates the times during the test cycle at which those state changes are to occur.

An electronic circuit tester must maintain extremely accurate tolerances so that the performance of a DUT may be characterized accurately. To this end, the timing and formatting circuit within each test channel must advance state changes in their DRIVE and TRISTATE output signals and delay state changes in their COMPARE output signals from the times indicated by their input TIMING data to account for signal path delays that are inherent in each test channel. Since the drive and compare signal path delays may vary from channel-to-channel, it is necessary to separately measure signal path delays for each channel during calibration.

The timing calibration of an electronic circuit tester may be performed manually with external measurement instruments. For example, voltmeters may be used to test voltage levels and oscilloscopes may be used to evaluate timing characteristics of each test channel of an electronic circuit tester. However, external testing of an electronic circuit tester is extremely time consuming, especially for high pin count electronic circuit testers. In an alternative approach, a calibration board may be connected to a test head to calibrate an electronic circuit tester (see, e.g., U.S. Pat. No. 5,539,305). Typically, an electronic circuit tester is calibrated based upon calibration standards, such as opens and shorts, that are connected serially to the test connectors of the test head. One conventional calibration method involves serially calibrating the timing of each test head pin with respect to a reference signal. The results of each measurement are stored in a storage device, such as a capture memory. After all the of the test head pins have been measured, a processor within the electronic circuit tester calibrates each test channel based upon the data stored in the capture memory.

In addition to the various timing calibration methods that have been proposed, techniques for verifying the timing calibration of electronic circuit testers have been developed. For example, manufacturers of electronic circuit testers typically provide a set of built-in-test (BIT) routines in which the drivers and receivers of a single selected pin are calibrated with respect to all of the other pins in the system. In accordance with this approach, the selected pin is connected to each of the other pins by cables and relays, one at a time. U.S. Pat. No. 6,192,496 describes another timing calibration verification approach in which a specially configured DUT board selectively shorts adjacent test channel lines together. In this way, each test channel may act as a sender and a receiver for a corresponding test channel so that the propagation delay of each test channel may be tested against the propagation delay of another test channel. In another timing calibration verification method, the specialized DUT board may be removed from the test head, so that each connector pin is disposed as an open circuit. This no-load condition results in maximum impedance mismatch within the line, and therefore maximizes the signal reflection back toward the driver. The receiver (companion receiver to the driver) may be configured to sense this reflection and, thereby, determine the timing of the signal (and therefore the cable length) between the driver and the connector pins in a time domain reflectometer measurement (TDR) test.

SUMMARY

The invention features novel systems and methods for calibrating the timing of electronic circuit testers and verifying the timing calibration of electronic circuit testers.

In one aspect, the invention features a system for calibrating an electronic circuit tester that includes a substrate, a connector interface, and a calibration circuit. The substrate is mountable on a test head of an electronic circuit tester, the test head having a plurality of test connectors terminating substantially in a plane. The connector interface is disposed on the substrate and comprises a plurality of test connector contact pads that are exposed for electrical contact with the test connectors. The calibration circuit is supported by the substrate and is electrically connected to the connector interface. The calibration circuit also is operable to connect test connectors to a source of a calibration reference signal and to one or more selected test connectors in accordance with protocols for calibrating the electronic circuit tester to the plane of the test connectors and verifying calibration of the electronic circuit tester.

Embodiments in accordance with this aspect of the invention may include one or more of the following features.

The connector interface preferably comprises one or more calibration reference signal contact pads that are exposed for electrical contact with one or more test connectors that are electrically coupled to a source of a calibration reference signal that is synchronized with a clock generator of the electronic circuit tester.

In some embodiments, the connector interface comprises a plurality of symmetrical test channel sites that are distributed over an exposed surface of the substrate, each test channel site comprising a plurality of contact pads that are exposed for electrical contact with respective test connectors of the test head. The connector interface preferably further comprises one or more reference sites each comprising one or more calibration reference signal contact pads. The connector interface may include multiple symmetrical sectors each of which comprises a reference site and multiple test channel sites. The calibration circuit may be configured to calibrate and verify calibration of a subset of test channels corresponding to test connectors that are electrically coupled to a single sector of connector interface at a time. The substrate may be mountable on the test head at different rotational positions to enable timing calibration and timing calibration verification of different subsets of the electronic circuit tester channels.

The calibration circuit preferably comprises a switching network that is supported by the substrate, is electrically coupled to the connector interface, and is operable to route signals to test connectors. The calibration circuit also may include a controller that is electrically coupled to the connector interface and the switching network. The controller may be configured to control the operation of the switching network based upon control signals that are received from one or more test connectors that are electrically coupled to the connector interface. The switching network may comprise one or more mechanical relay selection matrices.

The system may include an input/output interface that is supported by the substrate, is electrically coupled to the calibration circuit, and is configured to transmit signals between the calibration circuit and external test and measurement instruments.

In another aspect, the invention features a calibration system that includes a substrate that is mountable on a test head of an electronic circuit tester, a connector interface, and a calibration circuit. The test head has a plurality of test channel connectors that are coupled to test channels of the electronic circuit tester and one or more calibration reference signal connectors that are coupled to a source of a calibration reference signal, which is synchronized with a clock generator of the electronic circuit tester. The test channel connectors and the one or more calibration reference signal connectors terminate substantially in a plane. The connector interface is disposed on the substrate and comprises a plurality of test channel contact pads that are exposed for electrical contact with the test channel connectors, and one or more calibration reference signal pads that are exposed for electrical contact with the calibration reference signal connectors. The calibration circuit is supported by the substrate, is electrically connected to the connector interface, and is operable to connect test channel connectors to one or more calibration reference signal connectors in accordance with a protocol for calibrating the electronic circuit tester to the plane of the test head connectors.

Embodiments in accordance with this aspect of the invention may include one or more of the following features.

The calibration circuit may be further operable to connect test channel connectors to one or more selected test channel connectors in accordance with a protocol for verifying calibration of the electronic circuit tester In one embodiment, the calibration circuit comprises a plurality of comparators each of which is connected directly to a respective contact pad of the connector interface. In this embodiment, the calibration circuit may include a strobing circuit that is configured to provide an indication of test channel timing error with respect to the calibration reference signal, and a selector circuit that is coupled between each of the comparators and the strobing circuit. The calibration circuit also may be configured to route signals sequentially from the comparators to the strobing circuit.

In another aspect, the invention features a calibration system that includes a substrate, a connector interface, and a calibration circuit. The substrate is mountable on a test head of an electronic circuit tester, the test head having a plurality of test connectors terminating substantially in a plane. The connector interface is disposed on the substrate and comprises a plurality of test connector contact pads that are exposed for electrical contact with the test connectors. The calibration circuit is supported by the substrate, is electrically connected to the connector interface, and comprises a plurality of comparators each of which is connected directly to a respective test connector contact pad of the connector interface.

Embodiments in accordance with this aspect of the invention may include one or more of the following features.

The calibration circuit may include a strobing circuit that is configured to provide an indication of test channel timing error with respect to a calibration reference signal. The calibration circuit also may include a selector circuit that is coupled between each of the comparators and the strobing circuit and is operable to route signals sequentially from the comparators to the strobing circuit.

The calibration circuit preferably is implemented as an integrated circuit.

In another aspect, the invention features an electronic circuit tester system that includes a clock generator, a calibration reference signal generator, and a test head. The calibration reference signal generator is configured to generate a calibration reference signal that is synchronized with the test channel clock generator. The test head defines a plurality of test channels and has a plurality of test channel connectors that are coupled to the test channels, and one or more calibration reference signal connectors that are coupled to the calibration reference signal generator. The test channel connectors and the one or more calibration reference signal connectors terminate substantially in a plane.

Embodiments in accordance with this aspect of the invention may include one or more of the following features.

The clock generator and the calibration reference signal generator may be disposed on a common printed circuit board within the test head of the electronic circuit tester system.

Other features and advantages of the invention will become apparent from the following description, including the drawings and the claims.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

Figure 1A:
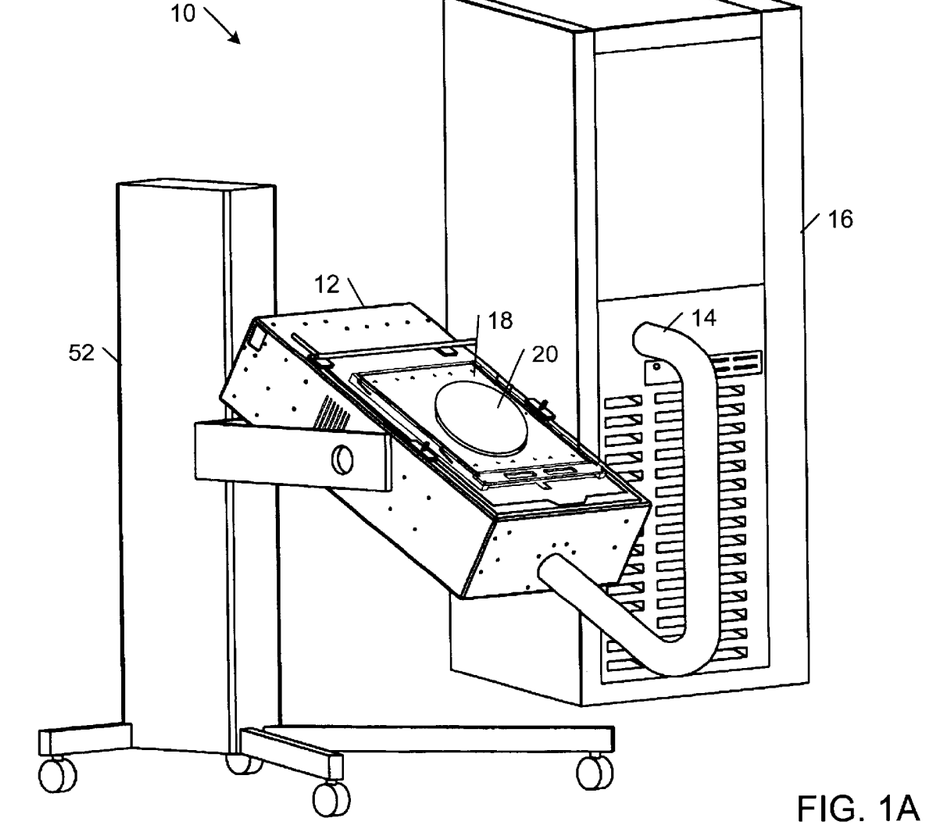
FIG. 1A is a diagrammatic perspective view of an electronic circuit tester and a probe card mounted on a load board that is connected to a test head of the electronic circuit tester.
Figure 1B:
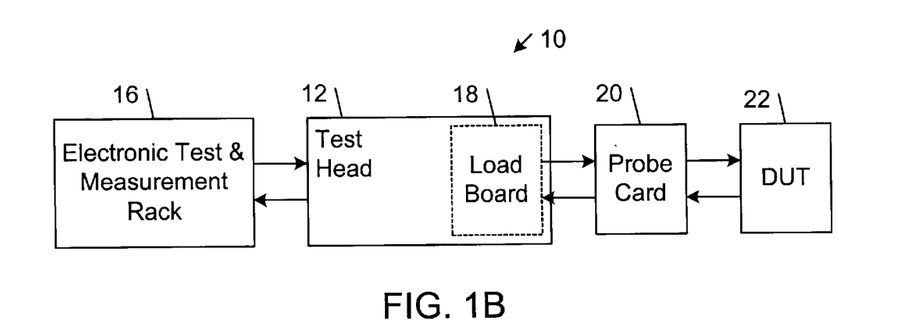
FIG. 1B is a block diagram of the electronic circuit tester of FIG. 1A with the probe card connected between the load board and a device under test (DUT).

Referring to FIGS. 1A, 1B, 1C and 1D, and initially to FIGS. 1A and 1B, in one embodiment, an electronic circuit tester 10 (e.g., an ATE system available from Agilent Technologies, Inc. of Palo Alto, Calif., U.S.A.) includes a test head 12. Test head 12 is electrically connected by cables that are routed through a conduit 14 to a rack 16 of electronic test and measurement instruments (e.g., ac and dc electrical signal generators, and signal analyzers, such as an oscilloscope and a network analyzer). As explained in detail below, a load board 18 provides a set of test connectors for interfacing the test channels within test head 12 with a probe card 20. Probe card 20, in turn, provides a set of probe connectors for interfacing with the terminals of a DUT 22. In normal operation, input test signals are transmitted from the test channels to drive selected terminals of DUT 22, and responsive output signals are transmitted from selected terminals of DUT 22 to the corresponding test channels of test head 12. By controllably varying the output levels of the input test signals and monitoring the responsive output signals, the functional operation of DUT 22 may be tested. In addition, electronic circuit tester 10 may verify whether the components of DUT 22 are operating within specified tolerance values or ranges.

Figure 1C:
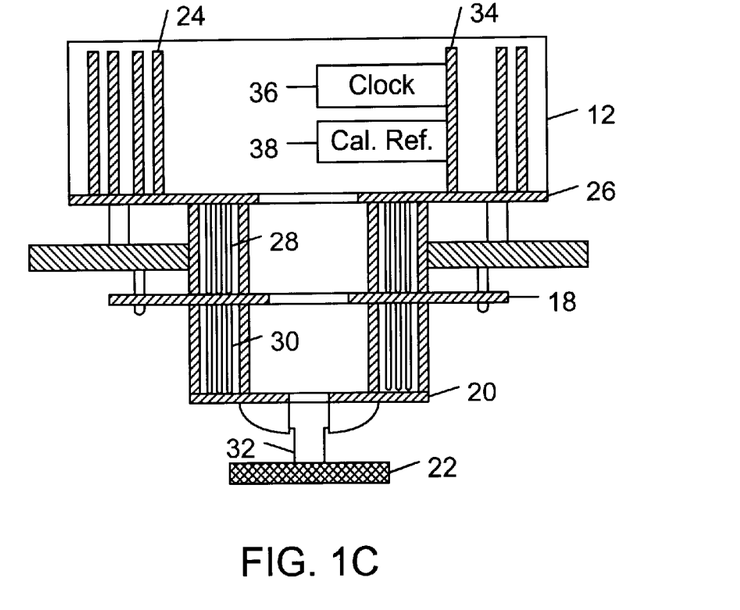
FIG. 1C is a diagrammatic cross-sectional side view of the test head, load board, probe card, and DUT of FIG. 1B.

As shown in FIG. 1C, test head 12 contains a plurality of printed circuit boards 24 that contain electrical circuitry that define test channels for testing a device or an integrated circuit. Test head 12 also may include a test head motherboard 26 that electrically connects and supports each of the individual printed circuit boards 24. Electrical test signals may be routed from the motherboard 26 to load board 18 through pogo pins 28. Load board 18 physically routes electrical test signals from the printed circuit boards 24 to a physical format that enables direct interfacing to probe card 20. In some embodiments, load board 18 also may contain test circuitry. Probe card 20 may connect to load board 18 through a plurality of test connectors 30 (e.g., pogo pins or mating electrical connectors). Probe card 20 contains conductive traces that route electrical test signals from load board 18 to a plurality of probe connectors 32 (e.g., probe needles). The sets of test connectors 30 and the sets of probe connectors 32 are precision manufactured so that the connectors of each set terminates in a respective common plane.

Test head 12 may include a clock board 34 on which is mounted a clock generator 36 and a calibration signal generator 38. Clock generator 36 may be a conventional phase-locked loop based clock generator circuit that generates the timing signals for electronic circuit tester 10. Calibration reference signal generator 38 buffers the clock signal produced by clock generator 36 to produce a calibration reference signal that is synchronized with the clock signal. In some embodiments, the clock signal may have a frequency of about 400 MHz and the calibration reference signal may have a frequency of about 3 MHz for calibration and a frequency of about 100 MHz for timing calibration verification. The calibration signal generator 38 is coupled electrically to load board 18 to enable the calibration reference signal to be transmitted directly through the test head load board interface for use during calibration and timing calibration verification.

Figure 1D:
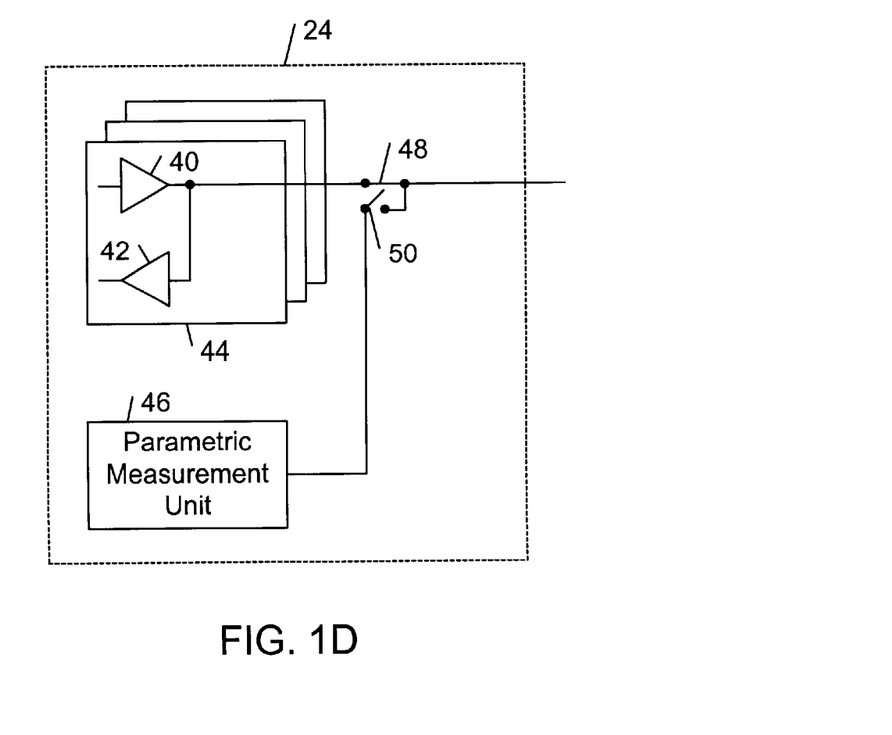
FIG. 1D is a block diagram of components of a circuit board defining test channels in the electronic circuit tester of FIG. 1A.

Referring to FIG. 1D, each circuit board 24 includes a plurality of drivers 40 and receivers 42. The drivers 40 may be configured to output signals to the test connectors 30 of load board 18. Typically, there are a plurality of pairs 44 of drivers 40 and receivers 42 on a single circuit board 24, each pair 44 defining a test channel of the electronic circuit tester 10. Each circuit board 24 also may include a parametric measurement unit 46 that is configured to quantify or measure signals. In operation, the parametric measurement unit 46 provides calibration data for the drivers 40 and receivers 42. Typically, multiple pairs of relays 48, 50 are configured to route signals to respective pairs of drivers 40 and receivers 42 of each circuit board 24. In operation, relay 48 selectively connects and disconnects the drivers 40 and receivers 42 from the load board test connectors 30, and relay 50 selectively connects the test connectors 30 to, for example, parametric measurement unit 46.

Test head 12 may be mounted pivotally on a dolly 52 (FIG. 1A) or other adjustable support mechanism so that electronic circuit tester 10 may be used to test both packaged devices and integrated circuits. The pivotable connections enable test head 12 to be positioned in an approximately upward facing horizontal position to enable an operator to mount an appropriate load board and probe card to test head 12. Test head 12 may be pivoted to a downward facing horizontal position to enable probe card 20 to interface with electrical terminals of DUT 22 through probe connectors 32.

Figure 2:
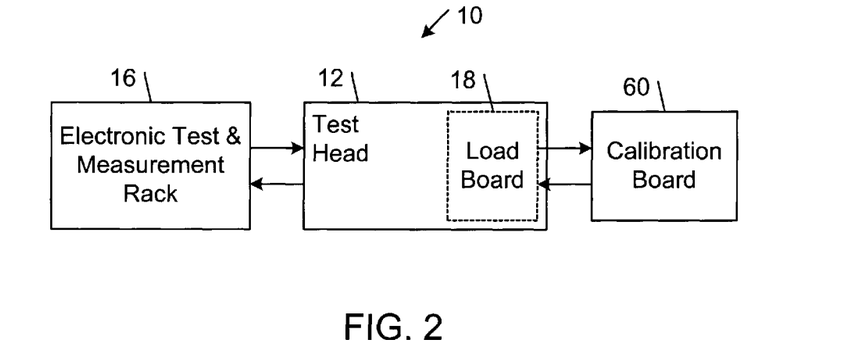
FIG. 2 is a block diagram of the electronic circuit tester of FIG. 1A and a calibration board mounted to the load board in place of the probe card.

As shown in FIG. 2, the timing of electronic circuit tester 10 may be calibrated by replacing probe card 20 with a calibration board 60. As explained in detail below, calibration board 60 is operable to route signals through the load board test connectors 30 in accordance with one or more prescribed calibration protocols. In addition, in some embodiments, calibration board 60 is operable route signals through the load board test connectors 30 in accordance with one or more prescribed timing calibration verification protocols.

Figure 3:
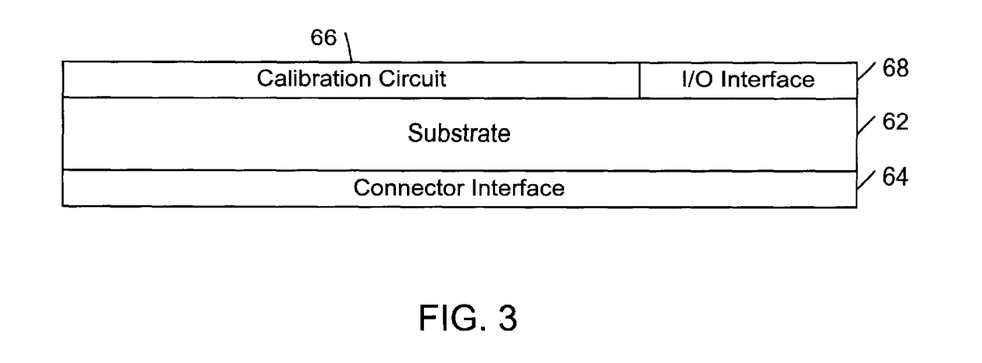
FIG. 3 is a diagrammatic perspective view of a calibration board that includes a calibration circuit, an I/O interface, and a connector interface that are mounted on a substrate.

Referring to FIG. 3, in one embodiment, calibration board 60 includes a substrate 62, a connector interface 64 that is disposed on substrate 62, and a calibration circuit 66 that is supported by substrate 62. Substrate 62 may be a multilevel printed circuit board that includes a top planar fiberglass layer that defines an engagement surface supporting connector interface 64. Connector interface 64 preferably includes an annular array of copper contact pads that are etched or deposited on the top layer of substrate 62 in accordance with a conventional etching or deposition process. The contact pads of connector interface 64 may be arranged to contact the test connectors 30 extending from load board 18. Calibration circuit 66 is connected electrically to the contact pads of connector interface 64 through the multiple layers of substrate 62 by conductive vias that extend vertically through one or more layers of substrate 62 to serve as inter-layer paths. Calibration circuit 66 is operable to control the flow of electrical signals to and from the load board test connectors 30 based upon control signals received from test head 12.

An input/output (I/O) interface 68 also may be mounted on substrate 62. I/O interface 68 is electrically coupled to calibration circuit 66 and is configured to transmit signals between the calibration circuit 66 and external test and measurement instruments in accordance with, for example, a GPIB (General Purpose Interface Bus) parallel connector protocol. I/O interface 68 enables an operator to measure delays through the channels of calibration board 60. An operator periodically may measure such delays to determine whether the electrical characteristics of calibration board 60 have changed over time, in which case the board may be repaired or replaced.

Figure 4A:
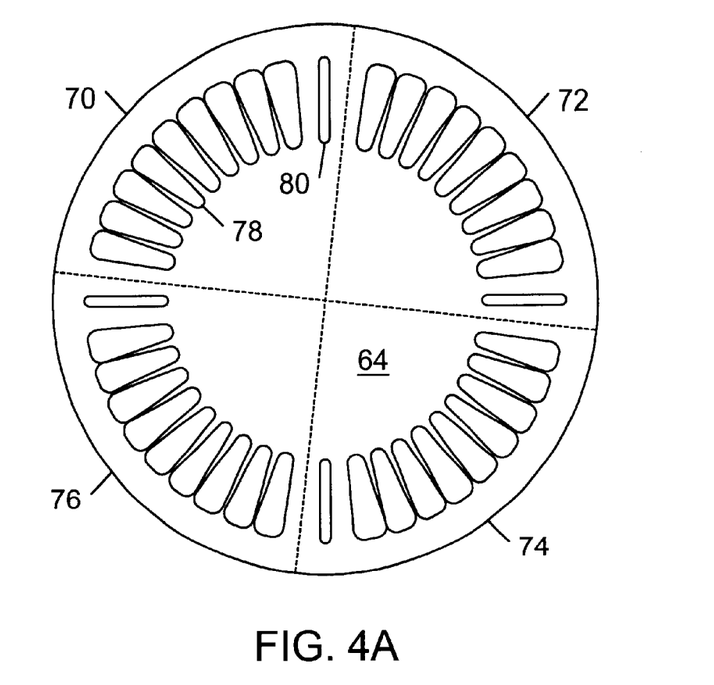
FIG. 4A is a diagrammatic top view of the connector interface of the calibration board of FIG. 3.
Figure 4B:
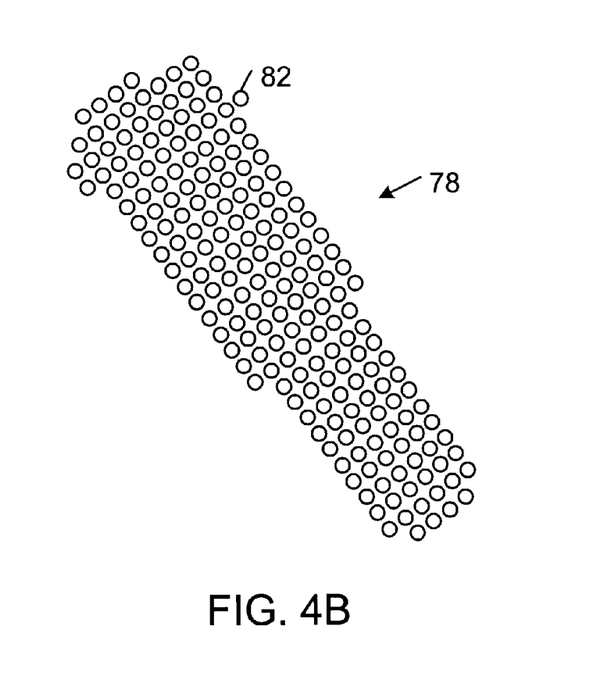
FIG. 4B is a diagrammatic top view of the contact pads of a connector site of the connector interface of FIG. 4A.

As shown in FIGS. 4A and 4B, in one embodiment, the contact pads of connector interface 64 are arranged into symmetrical sectors 70, 72, 74, 76, each of which contains multiple groups of symmetrical test channel sites 78 and a reference site 80. In the illustrated embodiment, connector interface 64 is divided into four quadrants, each of which includes nine test channel sites 78 and one reference site 80. As shown in FIG. 4B, each test channel site 78 includes a high-density layout of contact pads 82 that are exposed for contact with a respective test connector 30 of load board 18. In the illustrated embodiment, each test channel site 78 includes sixty-four test channel contact pads 82. Each reference site 80 includes contact pads that are exposed for contact with various reference load board test connectors, including a power connector, a ground connector, a calibration reference signal connector, and one or more control signal connectors.

In one embodiment, connector interface 64 includes a contact pad for each of the test connectors 30 extending from load board 18; however, due to space constraints, calibration circuit 66 is configured to calibrate and verify calibration of only a subset of the test channels of electronic circuit tester 10 at a time. In this embodiment, calibration circuit 66 is coupled electrically to the contact pads of only one sector 70–76 of connector interface 64. In the illustrated embodiment, such a construction enables the calibration board 60 to calibrate and verify calibration of one quarter of the test channels of electronic circuit tester 10 at a time. Calibration board 60 is mountable on test head 12 at different rotational positions to enable timing calibration and timing calibration verification of different subsets of the electronic circuit tester channels.

Figure 5:
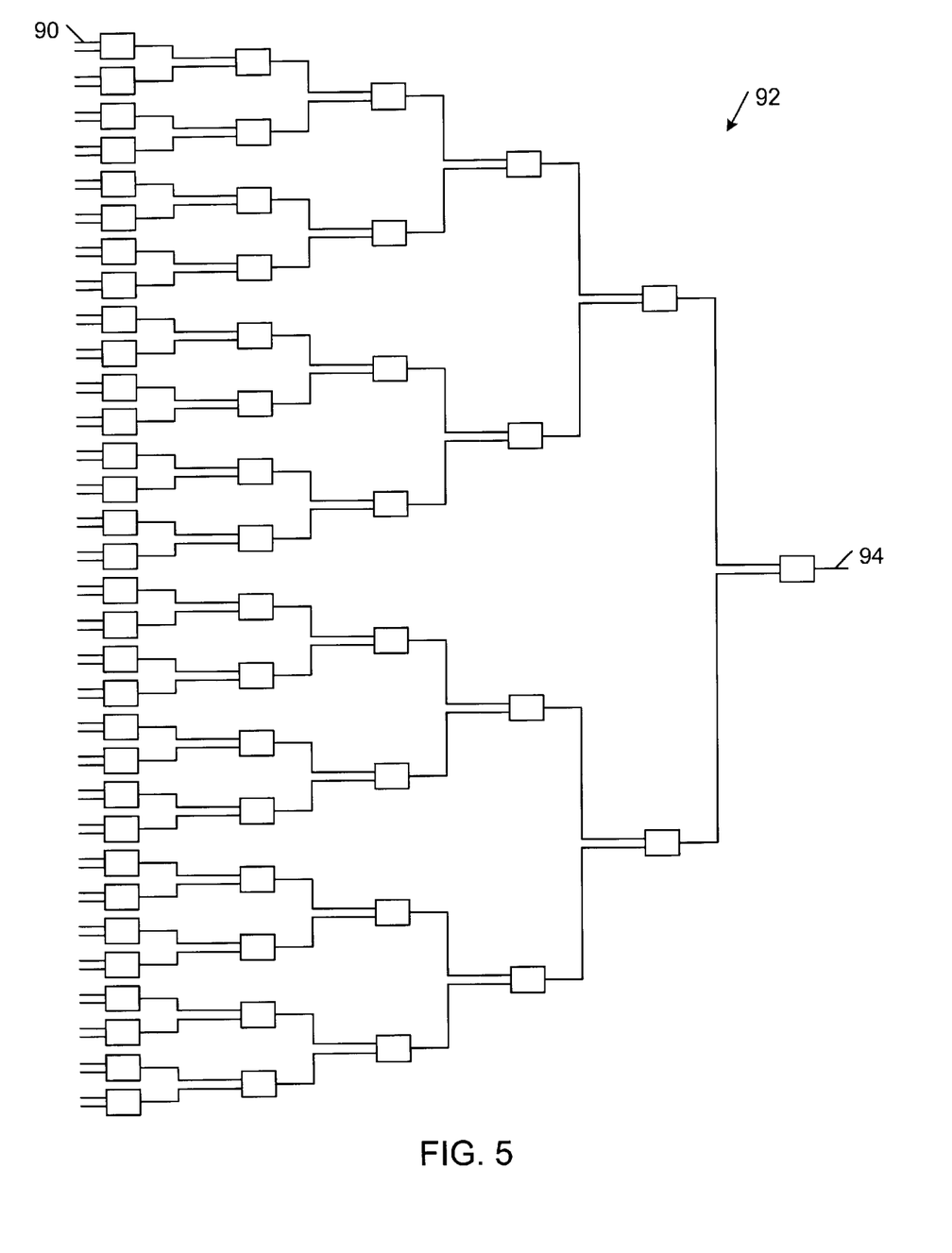
FIG. 5 is a schematic diagram of an intra-site relay matrix of the calibration circuit of FIG. 3 for one connector site of the connector interface of FIG. 4A.

Referring to FIG. 5, the contact pads 82 of each test channel site 78 are connected through the layers of substrate 62 to a respective input terminal 90 of an intra-site switching network 92. Intra-site switching network 92 is configured to selectively connect each of the contact pads 82 of a given test channel site to an output terminal 94 of the corresponding intra-site switching network 92. In one embodiment, intra-site switching network 90 is implemented as a tree matrix of high performance mechanical relays each of which operates as a bi-directional single-pole double-throw switch that is controlled by a control signal received from a controller of calibration circuit 66. The mechanical relays may be mounted to the surface of substrate 62 in accordance with a conventional printed circuit board surface mount technology (SMT) process. In operation, signals may be transmitted from one of the input terminals 90 to output terminal 94, and from output terminal 94 to one of the input terminals 90.

Figure 6:
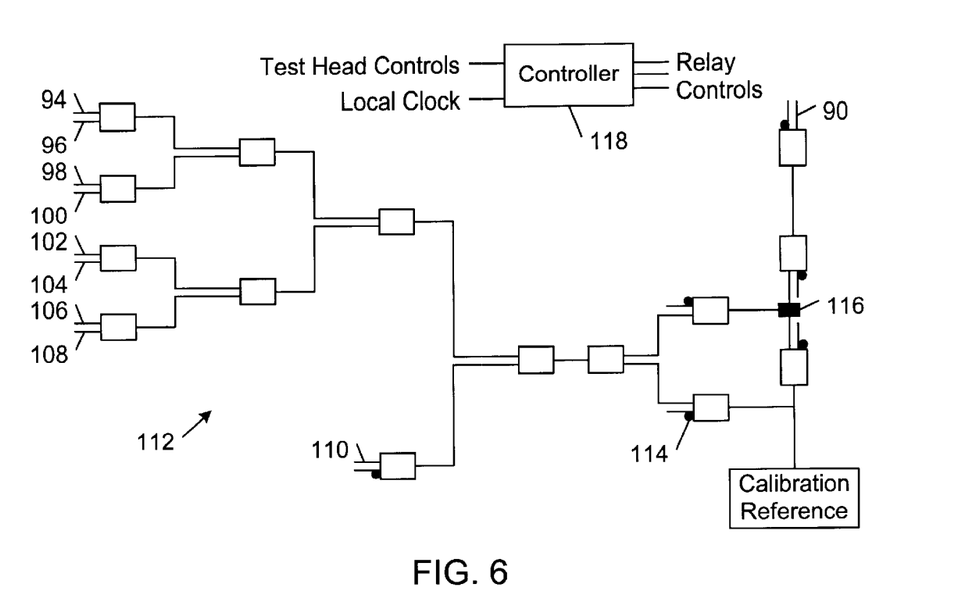
FIG. 6 is a schematic diagram of an inter-site relay matrix connecting the outputs of the intra-site relay matrices for the sites of one quadrant of the connector interface of FIG. 4A to a calibration reference signal contact pad and a selected verification test channel contact pad.

Referring to FIG. 6, the output terminals 94, 96, 98, 100, 102, 104, 106, 108, 110 of the intra-site switching networks 92 for the nine test channel sites 78 of a selected sector 70–76 of connector interface 64 are connected to the inputs of an inter-site switching network 112. Inter-site switching network 112 is configured to selectively connect each of the output terminals 94–110 to:

(1) a calibration reference signal connector of the reference site 80 in the same sector of connector interface 64;

(2) a selected one of the input terminals 90 of one of the intra-site switching networks 92 (e.g., input terminal 1 of site 1), which is designated herein as the "verification terminal"; or (3) or an open connection 114.

A fiber optic cable connector 116 (e.g., an SMA connector) couples the output of inter-site switching network 112 to the verification terminal. As explained in detail below, by this construction calibration board 60 enables each of the test channels of test head 12 to be selectively connected to a calibration reference signal during timing calibration, and to a test channel coupled electrically to the verification terminal or an open connection during timing calibration verification.

A controller 118 controls the flow of electrical signals through calibration board 60 based upon control signals that are received from test head 12 through one or more of the load board test connectors 30. In particular, controller 118 receives serially from test head 12 control data for implementing a timing calibration or a timing calibration verification of electronic circuit tester 10. In turn, controller 118 translates the serial test head control data into a set of parallel relay control signals that prescribe how electronic signals from test connectors 30 are to flow through the relay matrices of calibration board 60. In one embodiment, controller 118 is implemented as a conventional programmable logic device that may be programmed in accordance with a conventional synchronous, bi-directional serial interface data transfer standard (e.g., the MICROWIRE™ serial interface standard). In general, controller 118 is not limited to any particular hardware or software configuration, but rather may be implemented in any computing or processing environment, including in digital electronic circuitry or in computer hardware, firmware or software. Suitable processors include, for example, both general and special purpose microprocessors, and specially-designed ASICs (application-specific integrated circuits).

Figure 7:
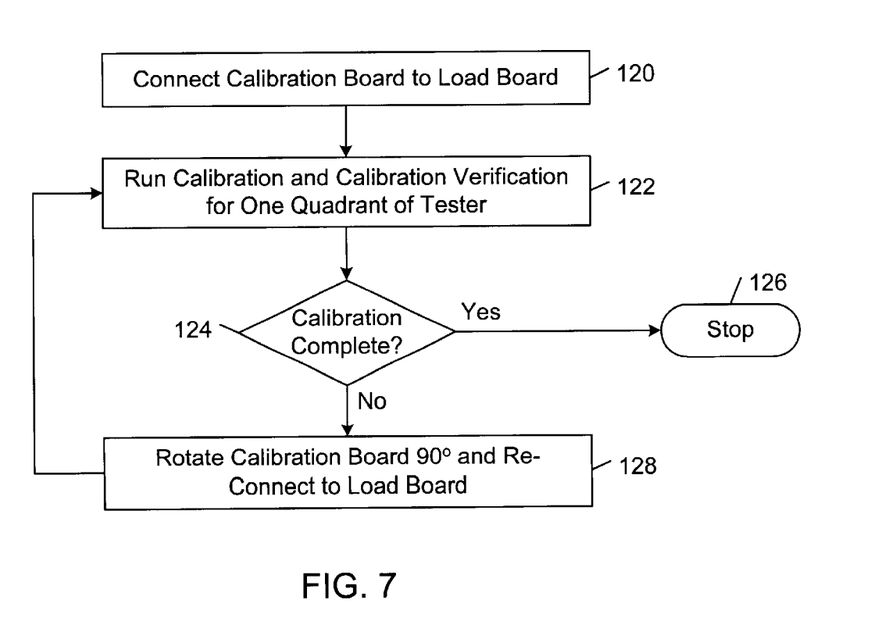
FIG. 7 is a flow diagram of a method of calibrating the timing and verifying the timing calibration of the electronic circuit tester of FIG. 1A with the calibration board of FIG. 3.

Referring to FIG. 7, in one embodiment, an operator may calibrate the timing of electronic circuit tester 10 with calibration board 60 as follows. Initially, calibration board 60 is connected to the load board 18 of test head 12 at a selected rotational position (step 120). The timing of a subset (e.g., one quarter in the illustrated embodiment) of the test channels of electronic circuit tester 10 is calibrated and the timing calibration for the subset of test channels is verified (step 122). If all of the test channels of electronic circuit tester 10 have been calibrated and the timing calibration has been verified (step 124), the process is terminated. Otherwise, calibration board 60 is rotated (e.g., by 90° in the illustrated embodiment) into alignment with the next subset of test channels to be calibrated and reconnected to load board 18 (step 128). The calibration process is repeated (step 122) until all of the test channels of electronic circuit tester 10 have been calibrated and the timing calibration has been verified (step 124).

Figure 8:
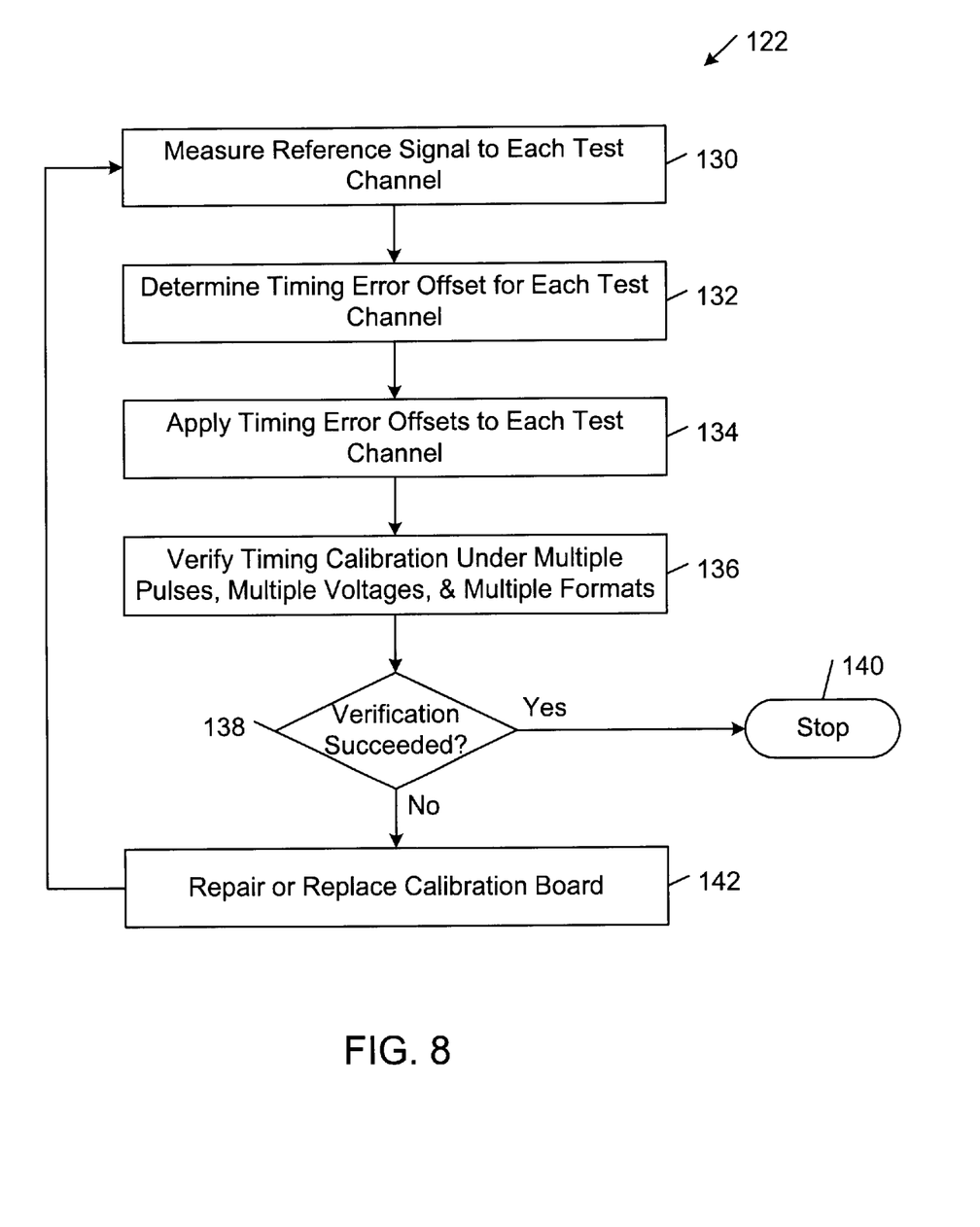
FIG. 8 is a flow diagram of a method of calibrating one quarter of the test channels of the electronic circuit tester of FIG. 1A.

Referring to FIG. 8, in one embodiment, the timing of each subset of electronic circuit tester test channels may be calibrated and the timing calibration may be verified as follows. The calibration reference signal is transmitted to each test channel (step 130). In the illustrate embodiment, the calibration reference signal is received from a test connector contacting a contact pad in the reference site 80 of connector interface 64. The timing error offset for each test channel is determined based upon the transmitted calibration reference signal (step 132). The timing error offset may be measured in a conventional way and stored, for example, in a capture memory of test head 12. The determined timing error offsets then are applied to each test channel (step 134). Next, the timing calibration is verified under multiple pulses, multiple voltages, and multiple formats in accordance with one or more conventional timing calibration verification protocols (step 136). For example, edge placement accuracy may be verified and the rise time, cable length and error offset for an edge of each test channel may be determined in accordance with the methods described in U.S. Pat. No. 6,192,496, which is incorporated herein by reference. If the timing calibration for each test channel is successfully verified (step 138), the process is terminated (step 140). Otherwise, calibration board 60 is repaired or replaced (step 142), and the timing calibration and timing calibration verification process is repeated (step 130).

In sum, the above-described embodiments provide an efficient and cost effective approach for both calibrating the timing and verifying the timing calibration of electronic circuit tester 10. In particular, by transmitting the calibration reference signal from test head 12 through the load board interface rather than through external instruments, timing errors associated with external wires and cables may be avoided. In addition, because the timing calibration and timing calibration verification may be performed simply by loading calibration board 60 to load board 18 at one or more rotational positions, the calibration set-up time may be reduced substantially relative to conventional robot-based calibrators. Also, by being configured to calibrate a subset of all of the test channels at a time, these embodiments enable the timing of high pin count electronic circuit testers to be readily calibrated with a calibration board that is characterized by a relatively small form factor.

Figure 9:
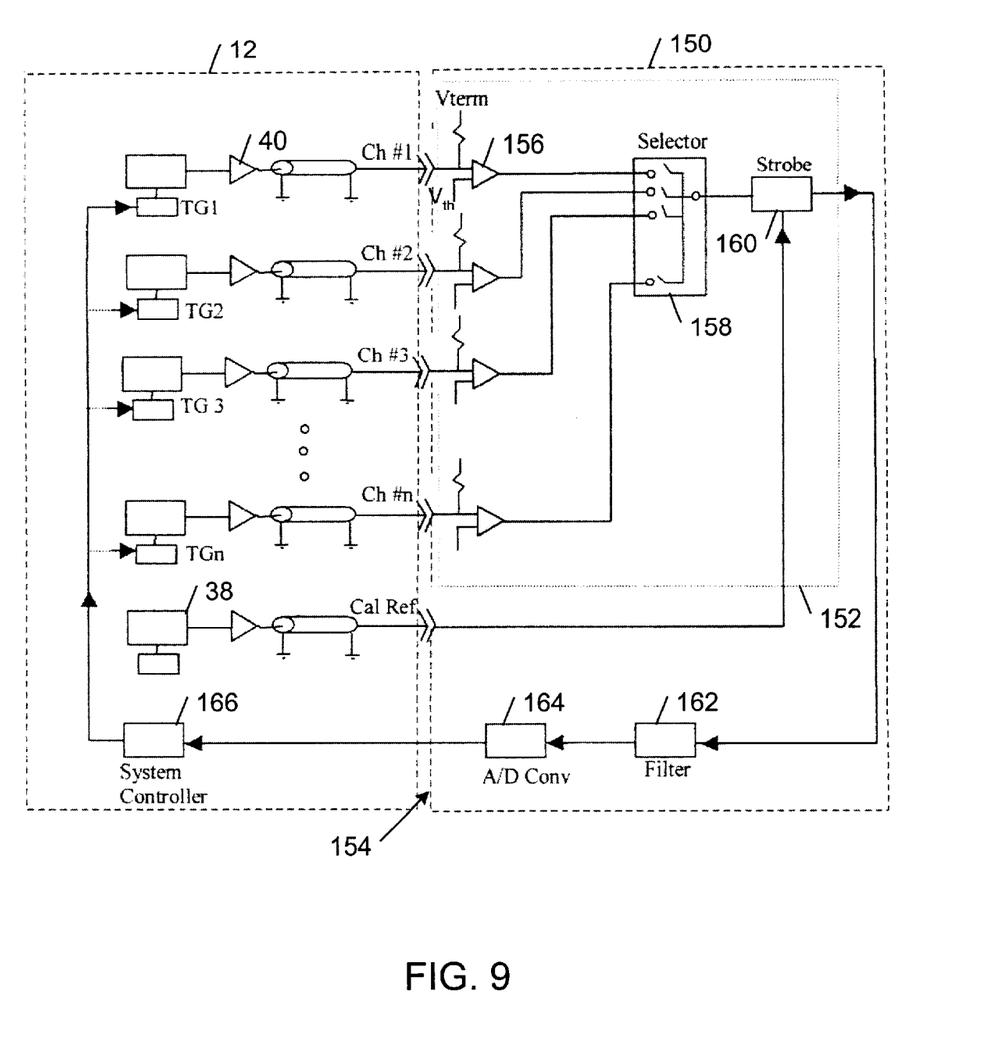
FIG. 9 is a schematic diagram of a test head of an electronic circuit tester and a calibration board that is mounted to the test head.

Referring to FIG. 9, in another embodiment, a calibration board 150 controls the flow of electronic signals received from the test channels (Ch #1, Ch #2, . . . , Ch #n) with a calibration circuit 152 that may be implemented as a single integrated circuit, rather than with one or more tree matrices of mechanical relays. In particular, the timing generator (TG1, TG2, . . . , TGn) of each test channel of test head 12 is coupled to a respective contact pad of a connector interface 154 of calibration board 150. Connector interface 154 may be implemented as a conventional calibration board connector interface. Each contact pad, in turn, is coupled directly to an input of a respective comparator 156. Each comparator 156 compares a test channel signal to a threshold voltage ($V_{th}$) to detect edges in the test channel signal. For high frequency applications, the test channel input of each comparator 156 is terminated with a 50 ohm impedance that is coupled to a termination voltage ($V_{term}$). For low frequency applications, the test channel input of each comparator may be unterminated. The output of each comparator 156 is coupled to a selector 158 (e.g., a conventional multiplexer circuit), which is configured to selectively direct one of the comparator output signals to the input of a strobe circuit 160 at a time. Strobe circuit 160 may be implemented as a conventional flip-flop strobe circuit, which is clocked by a calibration reference signal that is received from calibration reference signal generator 38. The output of strobe circuit 160 is fed through a conventional filter 162 and a conventional analog-to-digital (A/D) converter 164. The output of A/D converter 164 is coupled electrically to a system controller 166 of test head 12 through a load board test connector 30 contacting connector interface 154. In operation, system controller 166 measures the timing skew of each test channel based upon the signals received from strobe circuit 160 and sets the timing offset error of each test channel in accordance with a conventional timing calibration protocol.

In sum, the embodiment of FIG. 9 may be used to calibrate the timing of high pin count electronic circuit testers at high frequencies (e.g., on the order of about 2.5 GHz). In particular, because of the direct connection of the test channels to the calibration board comparators 156, this approach avoids the accumulated signal degradation (insertion loss, rise/fall time and delay error) that may result from transmitting tester channel signals through the large number stages of a mechanical relay selection matrix that would be needed to support a high pin count tester. In addition, because the switching components of the embodiment of FIG. 9 may be fabricated on a single monolithic semiconductor chip, the characteristic signal transmission time through the switching network to the strobe circuit 160 is short (e.g., on the order of 100 picoseconds or less) and the variation in signal path for each test channel is small (e.g., on the order of 5 picoseconds or less). In this way, the embodiment of FIG. 9 substantially reduces the signal path route errors that often are associated with the different signal transmission paths through a mechanical relay selection matrix for each test channel.

Other embodiments are within the scope of the claims.

What is claimed is:

1. A system for calibrating an electronic circuit tester, comprising:
    a substrate mountable on a test head of an electronic circuit tester, the test head having a plurality of test connectors terminating substantially in a plane;
    a connector interface disposed on the substrate and comprising a plurality of test connector contact pads exposed for electrical contact with the test connectors; and
    a calibration circuit supported by the substrate, electrically connected to the connector interface, and operable to connect test connectors to a source of a calibration reference signal and to one or more selected test connectors in accordance with protocols for calibrating the electronic circuit tester to the plane of the test connectors and verifying calibration of the electronic circuit tester.

2. The system of claim 1, wherein the connector interface comprises one or more calibration reference signal contact pads exposed for electrical contact with one or more test connectors electrically coupled to a source of a calibration reference signal synchronized with a clock generator of the electronic circuit tester.

3. The system of claim 2, wherein the connector interface comprises a plurality of symmetrical test channel sites distributed over an exposed surface of the substrate, each test channel site comprising a plurality of contact pads exposed for electrical contact with respective test connectors of the test head.

4. The system of claim 3, wherein the connector interface further comprises one or more reference sites each comprising one or more calibration reference signal contact pads.

5. The system of claim 4, wherein the connector interface comprises multiple symmetrical sectors each comprising a reference site and multiple test channel sites.

6. The system of claim 5, wherein the calibration circuit is configured to calibrate and verify calibration of a subset of test channels corresponding to test connectors electrically coupled to a single sector of connector interface at a time.

7. The system of claim 6, wherein the substrate is mountable on the test head at different rotational positions to enable timing calibration and timing calibration verification of different subsets of the electronic circuit tester channels.

8. The system of claim 1, wherein the calibration circuit comprises a switching network supported by the substrate, electrically coupled to the connector interface, and operable to route signals to test connectors.

9. The system of claim 8, wherein the calibration circuit further comprises a controller electrically coupled to the connector interface and the switching network, and configured to control the operation of the switching network based upon control signals received from one or more test connectors electrically coupled to the connector interface.

10. The system of claim 8, wherein the switching network comprises one or more mechanical relay selection matrices.

11. The system of claim 1, further comprising an input/output interface supported by the substrate, electrically coupled to the calibration circuit, and configured to transmit signals between the calibration circuit and external test and measurement instruments.

12. A system for calibrating an electronic circuit tester, comprising:
    a substrate mountable on a test head of an electronic circuit tester, the test head having a plurality of test channel connectors coupled to test channels of the electronic circuit tester and one or more calibration reference signal connectors coupled to a source of a calibration reference signal synchronized with a clock generator of the electronic circuit tester, the test channel connectors and the one or more calibration reference signal connectors terminating substantially in a plane;
    a connector interface disposed on the substrate and comprising a plurality of test channel contact pads exposed for electrical contact with the test channel connectors, and one or more calibration reference signal pads exposed for electrical contact with the calibration reference signal connectors; and
    a calibration circuit supported by the substrate, electrically connected to the connector interface, and operable to connect test channel connectors to one or more calibration reference signal connectors in accordance with a protocol for calibrating the electronic circuit tester to the plane of the test head connectors.

13. The system of claim 12, wherein the calibration circuit is further operable to connect test channel connectors to one or more selected test channel connectors in accordance with a protocol for verifying calibration of the electronic circuit tester.

14. The system of claim 12, wherein the calibration circuit comprises a plurality of comparators each connected directly to a respective contact pad of the connector interface.

15. The system of claim 14, wherein the calibration circuit further comprises a strobing circuit configured to provide an indication of test channel timing error with respect to the calibration reference signal, and a selector circuit coupled between each of the comparators and the strobing circuit and configured to route signals sequentially from the comparators to the strobing circuit.

16. A system for calibrating an electronic circuit tester, comprising:
    a substrate mountable on a test head of an electronic circuit tester, the test head having a plurality of test connectors terminating substantially in a plane;
    a connector interface disposed on the substrate and comprising a plurality of test connector contact pads exposed for electrical contact with the test connectors; and
    a calibration circuit supported by the substrate, electrically connected to the connector interface, and comprising a plurality of comparators each connected directly to a respective test connector contact pad of the connector interface.

17. The system of claim 16, wherein the calibration circuit further comprises a strobing circuit configured to provide an indication of test channel timing error with respect to a calibration reference signal, and a selector circuit coupled between each of the comparators and the strobing circuit and operable to route signals sequentially from the comparators to the strobing circuit.

18. The system of claim 16, wherein the calibration circuit is implemented as an integrated circuit.

19. An electronic circuit tester system, comprising:
    a clock generator;

a calibration reference signal generator configured to generate a calibration reference signal synchronized with the test channel clock generator; and a test head defining a plurality of test channels and having a plurality of test channel connectors coupled to the test channels and one or more calibration reference signal connectors coupled to the calibration reference signal generator, the test channel connectors and the one or more calibration reference signal connectors terminating substantially in a plane.

20. The system of claim 19, wherein the clock generator and the calibration reference signal generator are disposed on a common printed circuit board within the test head of the electronic circuit tester system.

* * * * *